US012575219B2

(12) United States Patent
Zhang et al.

(10) Patent No.: US 12,575,219 B2
(45) Date of Patent: Mar. 10, 2026

(54) SOLAR CELL AND PHOTOVOLTAIC MODULE

(71) Applicants: JINKO SOLAR CO., LTD., Jiangxi (CN); ZHEJIANG JINKO SOLAR CO., LTD., Zhejiang (CN)

(72) Inventors: Yuanfang Zhang, Jiangxi (CN); Menglei Xu, Jiangxi (CN); Jie Yang, Jiangxi (CN); Xinyu Zhang, Jiangxi (CN)

(73) Assignees: Jinko Solar Co., Ltd., Jiangxi (CN); Zhejiang Jinko Solar Co., Ltd., Haining (CN)

( * ) Notice: Subject to any disclaimer, the term of this patent is extended or adjusted under 35 U.S.C. 154(b) by 0 days.

(21) Appl. No.: 18/435,968

(22) Filed: Feb. 7, 2024

(65) Prior Publication Data

US 2025/0098335 A1 Mar. 20, 2025

(30) Foreign Application Priority Data

Sep. 15, 2023 (CN) .......................... 202311195893.5

(51) Int. Cl.
*H10F 77/30* (2025.01)
*H10F 10/172* (2025.01)
(Continued)

(52) U.S. Cl.
CPC ......... *H10F 77/311* (2025.01); *H10F 10/172* (2025.01); *H10F 10/19* (2025.01);
(Continued)

(58) Field of Classification Search
CPC ........ H10F 10/172; H10F 10/19; H10F 19/80; H10F 77/311; H10F 77/315; H10F 77/1662
See application file for complete search history.

(56) References Cited

U.S. PATENT DOCUMENTS

2014/0048122 A1 2/2014 Fogel et al.
2017/0323993 A1 11/2017 Björk et al.
(Continued)

FOREIGN PATENT DOCUMENTS

CN 102403371 B 12/2015
CN 110265494 A * 9/2019 ............. H10F 1/137
(Continued)

OTHER PUBLICATIONS

English machine translation of CN 110265494A. (Year: 2019).*
(Continued)

*Primary Examiner* — Lindsey A Buck
(74) *Attorney, Agent, or Firm* — USCH Law, PC

(57) ABSTRACT

Embodiments of the present disclosure relate to a solar cell and a photovoltaic module. The solar cell includes a thin-film solar cell and a bottom cell stacked in a first direction. The bottom cell has a stacked structure in the first direction including: a transparent conductive layer, a first doped conductive layer, an intrinsic amorphous silicon layer, a substrate, a selective passivation layer, and one or more electrodes. The selective passivation layer covers a portion of a surface of the substrate away from the intrinsic amorphous silicon layer and includes a plurality of passivation contact structures arranged at intervals in a second direction. Each passivation contact structure includes a tunneling layer and a second doped conductive layer stacked in the first direction. The electrodes are formed on a surface of the selective passivation layer away from the substrate and are in ohmic contact with second doped conductive layers.

18 Claims, 4 Drawing Sheets

(51) Int. Cl.
    *H10F 10/19*         (2025.01)
    *H10F 19/35*         (2025.01)
    *H10F 19/80*         (2025.01)
    *H10F 77/14*         (2025.01)
    *H10F 77/166*        (2025.01)

(52) U.S. Cl.
    CPC ........... *H10F 19/80* (2025.01); *H10F 77/315* (2025.01); *H10F 19/35* (2025.01); *H10F 77/143* (2025.01); *H10F 77/1662* (2025.01)

(56)                References Cited

U.S. PATENT DOCUMENTS

| | | | |
|---|---|---|---|
| 2018/0108796 A1 | 4/2018 | Heng et al. | |
| 2018/0158976 A1* | 6/2018 | Ahn | H10F 71/121 |
| 2019/0081189 A1 | 3/2019 | Mishima et al. | |
| 2021/0175450 A1* | 6/2021 | Kim | H10K 71/441 |
| 2023/0088548 A1 | 3/2023 | Yu et al. | |

FOREIGN PATENT DOCUMENTS

| | | |
|---|---|---|
| CN | 111357120 A | 6/2020 |
| CN | 210897294 U | 6/2020 |
| CN | 111628049 A | 9/2020 |
| CN | 112164729 A | 1/2021 |
| CN | 214477492 U | 10/2021 |
| CN | 113707734 A | 11/2021 |
| CN | 113948589 A | 1/2022 |
| CN | 115513339 A | 12/2022 |
| CN | 218769554 U | 3/2023 |
| CN | 116314372 A | 6/2023 |
| CN | 115172477 B | 8/2023 |
| EP | 3457448 B1 | 6/2022 |
| WO | 2012173959 A2 | 12/2012 |
| WO | 2020130318 A1 | 6/2020 |

OTHER PUBLICATIONS

Jinko Solar Co., Ltd. et al., Extended European Search Report, EP 24156661.1, Jul. 16, 2024, 9 pgs.

Jinko Solar Co., Ltd. et al., Extended European Search Report, EP 23220573.2, May 28, 2024, 7 pgs.

Jinko Solar Co., Ltd. et al., Extended European Search Report, EP 23220220.0, Jun. 5, 2024, 12 pgs.

Jinko Solar Co., Ltd. et al. US Non-Final Rejection, U.S. Appl. No. 18/407,377, Sep. 10, 2025, 16 pgs.

\* cited by examiner

SOLAR CELL AND PHOTOVOLTAIC MODULE

CROSS REFERENCE TO RELATED APPLICATIONS

The present application claims the benefit of priority under the Paris Convention to Chinese Patent Application No. 202311195893.5 filed on Sep. 15, 2023, which is incorporated herein by reference in its entirety.

TECHNICAL FIELD

Embodiments of the present disclosure relate to the field of solar cell technology, and in particular to a solar cell and a photovoltaic module.

BACKGROUND

Fossil energy may cause atmospheric pollution and has limited reserves. In contrast, solar energy has advantages such as cleanliness, pollution-free, and abundant reserves. Therefore, solar energy is gradually becoming the core clean energy substitute for fossil energy. Due to the good photoelectric conversion efficiency of solar cells, solar cells have become the focus of development for clean energy utilization.

The existing solar cells are limited by the wavelength range of light which is suitable to be absorbed and utilized, resulting in limited photoelectric conversion efficiency. In order to further improve the photoelectric conversion efficiency of a solar cell, a thin-film solar cell and a crystalline silicon solar cell that absorb light of different wavelengths may be stacked into a tandem solar cell, thereby improving the photoelectric conversion efficiency of the solar cell. However, there is a significant deviation between the photoelectric conversion efficiency of the existing tandem solar cells and theoretical photoelectric conversion efficiency.

SUMMARY

Embodiments of the present disclosure provide a solar cell and a photovoltaic module, which are at least conducive to improvement of photoelectric conversion efficiency of the solar cell.

Some embodiments of the present disclosure provide a solar cell including a thin-film solar cell and a bottom cell stacked in a first direction. The bottom cell has a stacked structure in the first direction including: a transparent conductive layer, a first doped conductive layer, an intrinsic amorphous silicon layer, a substrate, a selective passivation layer, and one or more electrodes. The transparent conductive layer is between the thin-film solar cell and the first doped conductive layer. The selective passivation layer covers a portion of a surface of the substrate away from the intrinsic amorphous silicon layer and includes a plurality of passivation contact structures arranged at intervals in a second direction. Each passivation contact structure of the plurality of passivation contact structures includes a tunneling layer and a second doped conductive layer stacked in the first direction. The one or more electrodes are formed on a surface of the selective passivation layer away from the substrate, at least one electrode of the one or more electrodes is in ohmic contact with the second doped conductive layer of a respective passivation contact structure of the plurality of passivation contact structures. The first doped conductive layer includes a doped amorphous silicon layer or a doped microcrystalline silicon layer.

In some embodiments, a thickness of the second doped conductive layer in the first direction ranges from 5 nm to 150 nm.

In some embodiments, a width of one respective passivation contact structure of the plurality of passivation contact structures in the second direction ranges from 10 μm to 100 μm.

In some embodiments, a surface of the substrate facing towards the selective passivation layer has a plurality of first textured regions and a plurality of first planar regions, each first textured region of the plurality of first textured regions aligns with a respective passivation contact structure of a set of passivation contact structures of the plurality of passivation contact structures, and each first planar region of the plurality of first planar regions is formed between two adjacent first textured regions of the plurality of first textured regions.

In some embodiments, surfaces of second doped conductive layers of at least a part of the set of passivation contact structures facing towards the one or more electrodes are textured surfaces.

In some embodiments, a surface of the substrate facing towards the selective passivation layer has a plurality of second textured regions and a plurality of second planar regions, each second planar region of the plurality of second planar regions aligns with a respective passivation contact structure of a set of passivation contact structures of the plurality of passivation contact structures, and each second textured region of the plurality of second textured regions is formed between two adjacent second planar regions of the plurality of second planar regions.

In some embodiments, a ratio of an area of an orthographic projection of the selective passivation layer on the substrate in the first direction to an area of a surface of the substrate facing towards the selective passivation layer ranges from 1% to 10%.

In some embodiments, a distance between two adjacent passivation contact structures of the plurality of passivation contact structures in the second direction ranges from 0.5 mm to 1.5 mm.

In some embodiments, a surface of the substrate facing towards the intrinsic amorphous silicon layer has a plurality of textured structures.

In some embodiments, heights of the plurality of textured structures of the surface of the substrate facing towards the intrinsic amorphous silicon layer in the first direction range from 50 nm to 1 μm.

In some embodiments, the first doped conductive layer includes first doped ions, each of the substrate and the second doped conductive layer includes second doped ions, and the first doped ions are P-type ions and the second doped ions are N-type ions, or the first doped ions are N-type ions and the second doped ions are P-type ions.

In some embodiments, the bottom cell further includes an anti-reflection layer. The anti-reflection layer is formed on a surface of the selective passivation layer away from the substrate, and the anti-reflection layer covers a portion of a surface of the substrate facing towards the selective passivation layer and covers lateral surfaces and surfaces away from the substrate of at least a portion of the plurality of passivation contact structures.

In some embodiments, a surface of the anti-reflection layer away from the substrate is a textured surface.

In some embodiments, the thin-film solar cell includes a perovskite thin-film solar cell, a copper indium gallium diselenide (CIGS) thin-film solar cell, a cadmium telluride thin-film solar cell, or a III to V-group thin-film solar cell.

Some embodiments of the present disclosure provide a photovoltaic module, including: one or more cell strings formed by connecting a plurality of the solar cells as above described; one or more encapsulation layers configured to cover at least one surface of the one or more cell strings; and one or more cover plates configured to cover at least one surface of the one or more encapsulation layers away from the one or more cell strings.

BRIEF DESCRIPTION OF THE DRAWINGS

One or more embodiments are exemplarily illustrated in reference to corresponding accompanying drawing(s), and these exemplary illustrations do not constitute limitations on the embodiments. Unless otherwise stated, the accompanying drawings do not constitute scale limitations.

DETAILED DESCRIPTION OF THE EMBODIMENTS

Figure 1:
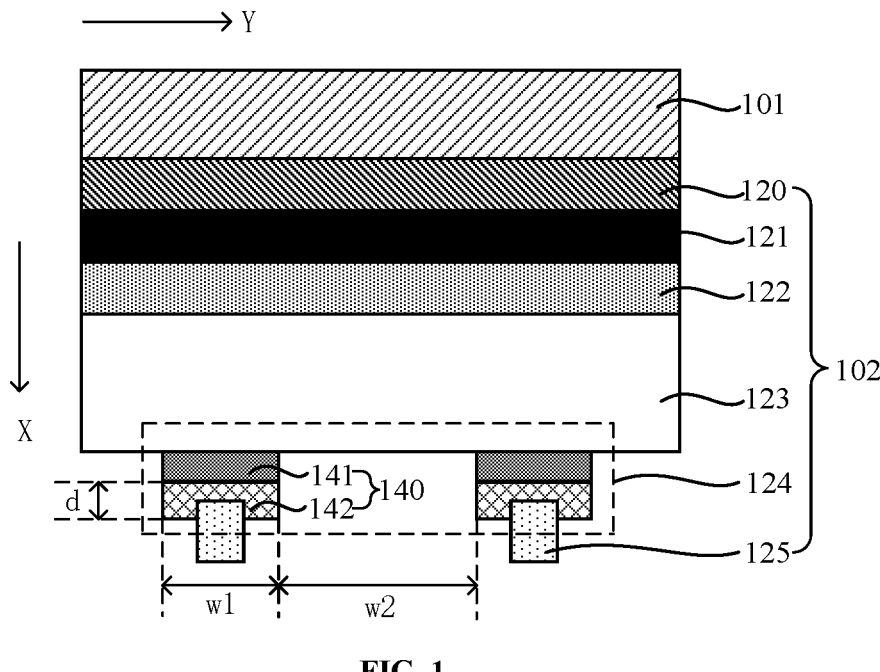
FIG. 1 is a schematic diagram of a sectional structure of a solar cell according to some embodiments of the present disclosure.

When a certain part "includes" another part throughout the specification, other parts are not excluded unless otherwise stated, and other parts may be further included. In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise.

It can be known from the background art that there is a significant deviation between the photoelectric conversion efficiency of the existing tandem solar cells and theoretical photoelectric conversion efficiency. The reasons why the photoelectric conversion efficiency of a tandem solar cell is limited include the recombination loss between a bottom cell and a top cell, as well as the performance loss of the bottom cell. In an existing process of manufacturing tandem solar cells, some of the structure of the bottom cell is generally removed, then a transparent conductive layer is formed on the exposed semiconductor conductive layer of the bottom cell as a functional layer connecting the bottom cell and the top cell, and then the top cell is formed on the transparent conductive layer. Due to the removal of some of the structure of the bottom cell, the loss in open-circuit voltage of the bottom cell increases, and the photoelectric conversion efficiency of the bottom cell decreases, thereby limiting the actual photoelectric conversion efficiency of the tandem solar cell. When the transparent conductive layer and the top cell are directly formed on the original structure of the bottom cell, a metal-semiconductor contact is formed between the electrodes of the bottom cell and the transparent conductive layer, thereby greatly increasing the contact recombination between the top cell and the bottom cell, which also limits the photovoltaic conversion efficiency of the tandem solar cell.

Some embodiments of the present disclosure provide a tandem solar cell, in the tandem solar cell, the bottom cell is mainly based on a tunnel oxide passivated contact solar cell, with a front structure of the tunnel oxide passivated contact solar cell being replaced with a front structure of a heterojunction solar cell, and the thin-film solar cell and the bottom cell are connected using the transparent conductive layer in the front structure of the heterojunction solar cell. With the replacement of the front structure, the bottom cell can have a complete front structure, which can improve the open-circuit voltage of the bottom cell, and can prevent the formation of metal-semiconductor contact between the electrodes on the front surface and the transparent conductive layer of the bottom cell having the complete structure. In this way, the contact recombination between the thin-film solar cell and the bottom cell can be reduced, and the photoelectric conversion efficiency of the solar cell can be improved. Moreover, the back passivation structure of the tunnel oxide passivated contact solar cell is replaced with a selective passivation layer having a plurality of passivation contact structures corresponding to the electrodes, due to the fact that the plurality of passivation contact structures only cover a part of the surface of the substrate, the electrodes can be formed using electroplating, thereby greatly reducing the possibility of burn-through of the second doped conductive layers by the electrodes. Therefore, the thicknesses of the second doped conductive layers of the plurality of passivation contact structures of the selective passivation layer can be reduced. Furthermore, due to the transparent conductive layer in the front structure, there is no need to form an additional transparent conductive layer to connect the bottom cell and the thin-film solar cell, thereby reducing the overall thickness and cost of the tandem solar cell.

Embodiments of the present disclosure will be described in detail below with reference to the accompanying drawings. Those skilled in the art should understand that, in the embodiments of the present disclosure, many technical details are provided for the reader to better understand the present disclosure. However, even without these technical details and various modifications and variants based on the following embodiments, the technical solutions claimed in the present disclosure can be implemented.

Some embodiments of the present disclosure provide a solar cell. Referring to FIG. 1, FIG. 1 is a schematic diagram of a sectional structure of the solar cell. In FIG. 1, the X direction represents the first direction, and the Y direction represents the second direction.

The solar cell includes a thin-film solar cell 101 and a bottom cell 102 stacked in a first direction. The bottom cell 102 has a stacked structure in the first direction including: a transparent conductive layer 120, a first doped conductive layer 121, an intrinsic amorphous silicon layer 122, a substrate 123, a selective passivation layer 124, and one or more electrodes 125. The transparent conductive layer 120 is between the thin-film solar cell 101 and the first doped conductive layer 121. The selective passivation layer 124 covers a portion of a surface of the substrate 123 away from the intrinsic amorphous silicon layer 122 and includes a plurality of passivation contact structures 140 arranged at intervals in a second direction. Each passivation contact structure of the plurality of passivation contact structures 140 includes a tunneling layer 141 and a second doped conductive layer 142 stacked in the first direction. The one or more electrodes 125 are formed on a surface of the selective passivation layer 124 away from the substrate 123, at least one electrode of the one or more electrodes 125 is in ohmic contact with the second doped conductive layer 142 of a respective passivation contact structure of the plurality of passivation contact structures 140. The first doped conductive layer 121 includes a doped amorphous silicon layer or a doped microcrystalline silicon layer.

In the tandem solar cell, the bottom cell 102 is mainly based on a tunnel oxide passivated contact solar cell, with a front structure of the tunnel oxide passivated contact solar cell being replaced with a front structure of a heterojunction solar cell, and the thin-film solar cell 101 and the bottom cell 102 are connected using the transparent conductive layer 120 in the front structure of the heterojunction solar cell. With the replacement of the front structure, the bottom cell 102 can have a complete back structure, which can improve the open-circuit voltage of the bottom cell 102, and can prevent the formation of metal-semiconductor contact between the electrodes on the front surface and the transparent conductive layer 120 of the bottom cell 102 having the complete structure. In this way, the contact recombination between the thin-film solar cell 101 and the bottom cell 102 can be reduced, and the photoelectric conversion efficiency of the solar cell can be improved. Moreover, the back passivation structure of the tunnel oxide passivated contact solar cell is replaced with the selective passivation layer 124 having the plurality of passivation contact structures 140 corresponding to the one or more electrodes 125, due to the fact that the plurality of passivation contact structures 140 only cover a part of the surface of the substrate 123, the one or more electrodes 125 can be formed using electroplating, thereby greatly reducing the possibility of burn-through of the second doped conductive layers 142 by the one or more electrodes 125. Therefore, the thicknesses of the second doped conductive layers 142 of the plurality of passivation contact structures 140 can be reduced. Furthermore, due to the transparent conductive layer 120 in the front structure, there is no need to form an additional intermediate layer to connect the bottom cell 102 and the thin-film solar cell 101, thereby reducing the overall thickness and cost of the tandem solar cell.

In some embodiments, material of the substrate 123 may be an elemental semiconductor material. In some embodiments, the elemental semiconductor material may be composed of a single element, such as silicon or germanium. The elemental semiconductor material may be in a monocrystalline state, a polycrystalline state, an amorphous state, or a microcrystalline state (in which the monocrystalline state and the amorphous state present concurrently). For example, silicon may be at least one of monocrystalline silicon, polycrystalline silicon, amorphous silicon, or microcrystalline silicon.

The material of the substrate 123 also may be a compound semiconductor material. Common compound semiconductor materials include, but are not limited to, materials such as silicon germanide, silicon carbide, gallium arsenide, indium gallide, perovskite, cadmium telluride, copper indium selenium, or the like. The substrate 123 also may be a sapphire substrate, a silicon substrate disposed on an insulator, or a germanium substrate disposed on an insulator.

The substrate 123 may be an N-type semiconductor substrate or a P-type semiconductor substrate. The N-type semiconductor substrate is doped with an N-type doping element, which may be any of the V-group elements such as phosphorus (P), bismuth (Bi), antimony (Sb), or arsenic (As). The P-type semiconductor substrate is doped with a P-type element, which may be any of the III-group elements such as boron (B), aluminum (Al), gallium (Ga), or indium (In).

Moreover, when the solar cell receives light with a single side, the solar cell has a light-receiving surface and a back surface opposite to each other, and the front structure of the solar cell refers to the functional layers between the light-receiving surface and the substrate of the solar cell. When the solar cell receives light with both sides, the solar cell has a light-receiving surface with higher intensity of incident light and another light-receiving surface with lower intensity of incident light, and the front structure of the solar cell refers to the functional layers between the light-receiving surface with higher intensity of incident light and the substrate of the solar cell.

In some embodiments, the one or more electrodes 125 may be one or more metal electrodes with good conductivity, such as copper electrodes, silver electrodes, or aluminum electrodes. The one or more electrodes 125 may also be formed by other conductive materials with good conductivity, such as graphene electrodes or superconductor electrodes.

In some embodiments, the transparent conductive layer 120 may be at least one of an ITO film, an IZO film, an AZO film, an IWO film, a FTO film, a ZnO film, a strontium indium oxide film, or an IXO film.

In some embodiments, the material of the tunneling layer 141 may include at least one of silicon oxide, silicon nitride, silicon oxynitride, silicon carbide, or magnesium fluoride.

In some embodiments, the material of the second doped conductive layer 142 may include at least one of silicon oxide, silicon nitride, silicon oxynitride, carbon nitrogen silicon oxide, titanium oxide, hafnium oxide, aluminium oxide, or the like.

In some embodiments, a thickness of the intrinsic amorphous silicon layer 122 in the first direction ranges from 1 nm to 10 nm.

The thickness of the intrinsic amorphous silicon layer 122 in the first direction refers to a distance along the first direction between a surface of the intrinsic amorphous silicon layer 122 in contact with the substrate 123 and a surface of the intrinsic amorphous silicon layer 122 in contact with the first doped conductive layer 121.

The thickness of the intrinsic amorphous silicon layer 122 may range from 1 nm to 10 nm, such as 1.25 nm, 1.5 nm, 1.75 nm, 2.5 nm, 3 nm, 3.5 nm, 4.75 nm, 5.5 nm, 6.5 nm, 8 nm, or 9.5 nm. By setting the thickness of the intrinsic amorphous silicon layer 122 in the first direction within an appropriate range, a good field passivation effect can be achieved by a combination of the intrinsic amorphous silicon layer 122 with the first doped conductive layer 121. In this way, the transfer ability of the carriers in the substrate 123 to the intrinsic amorphous silicon layer 122 can be improved. Moreover, reduction in the shortwave effect due to excessive thickness of the intrinsic amorphous silicon layer 122 and increase in the absorption ability to light of relatively large wavelengths can be prevented, thereby reducing loss in incident light for the substrate 123, and improving the light-absorption rate of the bottom cell 102.

Figure 2:
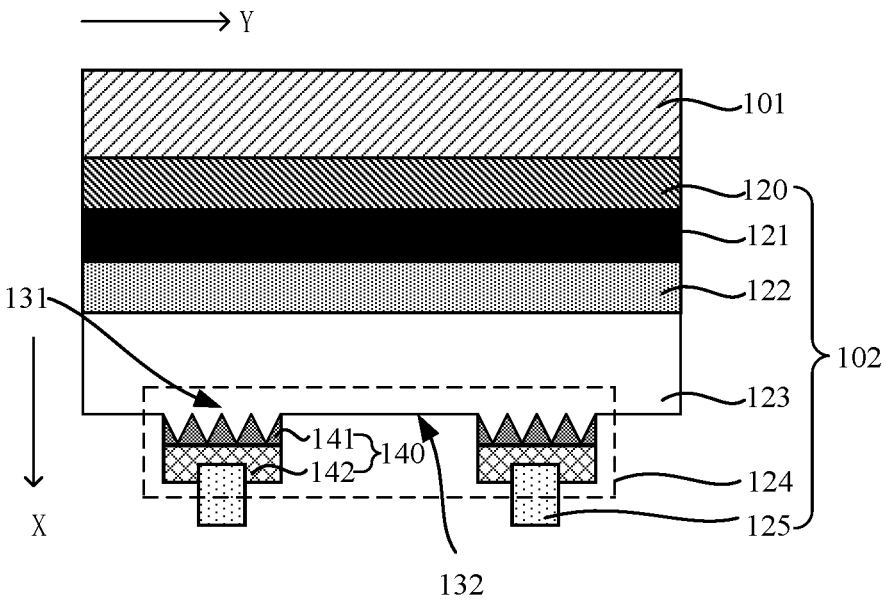
FIG. 2 is a schematic diagram of a sectional structure of another solar cell according to some embodiments of the present disclosure.

Referring to FIG. 2, FIG. 2 is a schematic diagram of a sectional structure of another solar cell. In FIG. 2, a surface of the substrate 123 facing towards the selective passivation layer 124 is locally planar. In some embodiments, the surface of the substrate 123 facing towards the selective passivation layer 124 has a plurality of first textured regions 131 and a plurality of first planar regions 132, each first textured region of the plurality of first textured regions 131 aligns with a respective passivation contact structure of a set of passivation contact structures of the plurality of passivation contact structures 140, and each first planar region of the plurality of first planar regions 132 is formed between two adjacent first textured regions of the plurality of first textured regions 131.

During production of the bottom cell 102, in order to reduce the carrier recombination of the bottom cell 102 on the surface of the substrate 123, the surface of the substrate 123 facing towards the selective passivation layer 124 is usually formed into a planar surface. However, after forming the plurality of passivation contact structures 140 on the surface of the substrate 123, the contact area between the plurality of passivation contact structures 140 and the substrate 123 is small, resulting in relatively great loss in carriers generated in the substrate 123 during transfer of the carriers to the passivation contact structures 140. Moreover, the optical path of incident light in the substrate 123 is relatively short, resulting in low light-absorption efficiency of the substrate 123, and limited photoelectric conversion efficiency of the solar cell.

Therefore, during production of the bottom cell 102, the surface of the bottom cell 102 facing towards the selective passivation layer 124 may be formed to have a plurality of first textured regions 131 and a plurality of first planar regions 132 interleaving with the plurality of first textured regions 131, and each first textured region of the plurality of first textured regions 131 aligns with a respective passivation contact structure of a set of passivation contact structures of the plurality of passivation contact structures 140 of the selective passivation layer 124. With the plurality of first textured regions 131 aligning with the set of passivation contact structures 140, the contact area between the passivation contact structures 140 and the substrate 123 can be increased, the loss in carriers during transfer from the substrate 123 to the passivation contact structures 140 can be reduced, and the photoelectric conversion efficiency of the solar cell can be improved.

Figure 3:
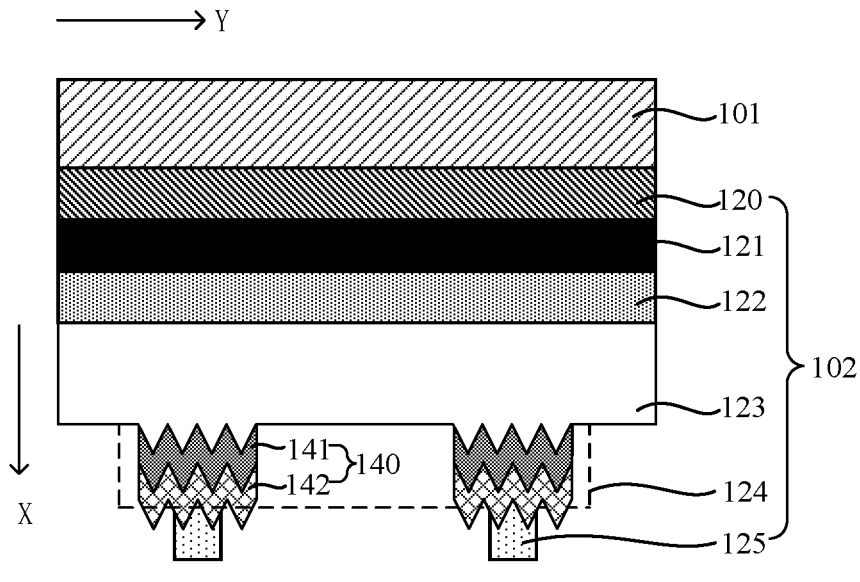
FIG. 3 is a schematic diagram of a sectional structure of yet another solar cell according to some embodiments of the present disclosure.

Referring to FIGS. 2 and 3 in combination, FIG. 3 is a schematic diagram of a sectional structure of yet another solar cell. In FIG. 3, surfaces of the second doped conductive layers 142 facing towards the one or more electrodes 125 are textured surfaces. In some embodiments, the surfaces of second doped conductive layers 142 of at least a part of the set of passivation contact structures 140 facing towards the one or more electrodes 125 are textured surfaces.

The factors that influence the photoelectric conversion efficiency of the solar cell further include the collection loss of carriers during collection of the carriers by the one or more electrodes 125, and the collection loss of carriers is negatively correlated with the contact resistance between the one or more electrodes 125 and the second doped conductive layers 142. One respective passivation contact structure 140 is usually formed by sequentially forming the tunneling layer 141 and the second doped conductive layer 142 on the surface of the substrate 123 using deposition. The deposition process includes chemical vapor deposition, physical vapor deposition, atomic layer deposition or the like.

When forming the passivation contact structures 140 on the textured regions of the substrate 123, the surfaces of the second doped conductive layers 142 formed by the deposition process facing towards the one or more electrodes 125 are usually textured surfaces. After forming the one or more electrodes 125, the one or more electrodes 125 contact with the textured surfaces of the second doped conductive layers 142. Compared with the planar surfaces, the contact area between the one or more electrodes 125 and the second doped conductive layers 142 can be significantly increased, thereby reducing the contact resistance between the one or more electrodes 125 and the second doped conductive layers 142, as well as the loss in the one or more electrodes 125 during collection of the carriers, which is conducive to improving the photoelectric conversion efficiency of the solar cell.

In some embodiments, during production of the passivation contact structures 140, the functional layers of one respective passivation contact structure 140 may be formed by deposition on a first textured region 131 of the substrate 123, to form the second doped conductive layers 142 whose surfaces facing towards the one or more electrodes 125 are textured surfaces. Alternatively or in addition, the functional layers of the plurality of passivation contact structures 140 may be formed by deposition on a surface of the substrate 123 which is fully planar, or the functional layers of one respective passivation contact structure 140 may be formed by deposition on a first planar region of the substrate 123. Then, at least a part of the formed passivation contact structures 140 is selected, and selective etching is performed on the second doped conductive layers 142 of the selected passivation contact structures 140, such that the surfaces of the second doped conductive layers 142 facing towards the one or more electrodes 125 are etched into textured surfaces.

Thus, the surface of the substrate 123 facing towards the selective passivation layer 124 may be fully planar or may have the plurality of first textured regions and the plurality of first planar regions. Regardless of the surface of the substrate 123 facing towards the selective passivation layer 124 being fully planar or locally planar, surfaces of either a part of the second doped conductive layers 142 or all the second doped conductive layers 142 facing towards the one or more electrodes 125 may be textured surfaces.

Figure 4:
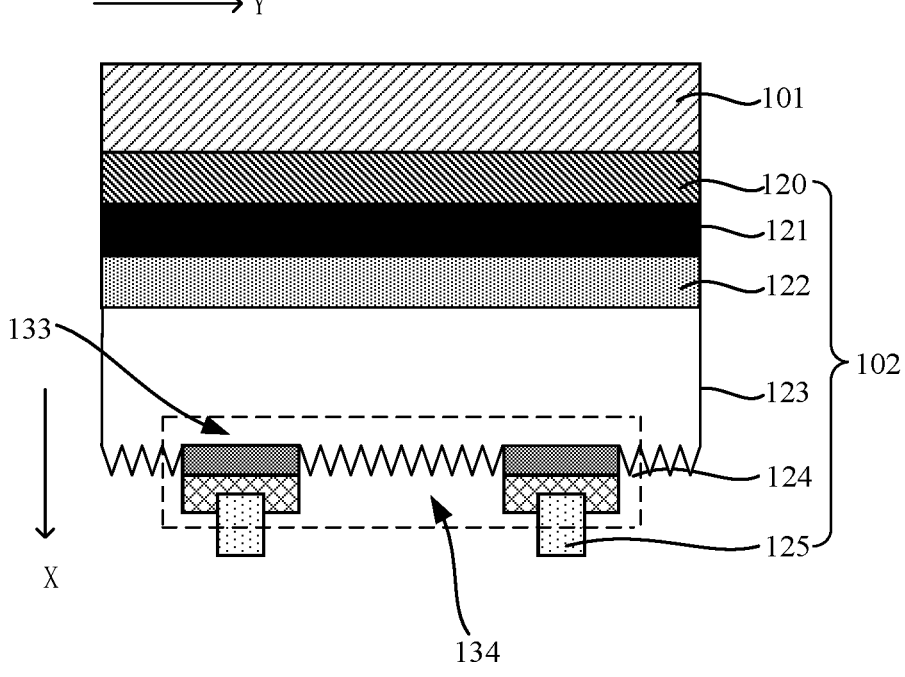
FIG. 4 is a schematic diagram of a sectional structure of still another solar cell according to some embodiments of the present disclosure.

Referring to FIGS. 1 and 4 in combination, FIG. 4 is a schematic diagram of a sectional structure of still another solar cell. In FIG. 4, the surface of the substrate 123 facing towards the selective passivation layer 124 is locally planar. In some embodiments, the surface of the substrate 123 facing towards the selective passivation layer 124 has a plurality of second textured regions 134 and a plurality of second planar regions 133, each second planar region of the plurality of second planar regions 133 aligns with a respective passivation contact structure of a set of passivation contact structures of the plurality of passivation contact structures 140, and each second textured region of the plurality of second textured regions 134 is formed between two adjacent second planar regions of the plurality of second planar regions 133.

The factors that influence the photoelectric conversion efficiency of the solar cell further include light-absorption efficiency of the solar cell. When the surface of the substrate 123 facing towards the selective passivation layer 124 is a textured surface, the textured structures can increase the optical path of incident light in the substrate 123, thereby improving the light-absorption efficiency of the substrate 123. However, the textured structures also result in significant increase in the carrier recombination current at the surface of the substrate 123 facing towards the selective passivation layer 124, which limits the photoelectric conversion efficiency of the bottom cell 102.

Therefore, the surface of the substrate 123 facing towards the selective passivation layer 124 may be formed to have a plurality of second planar regions 133 and a plurality of second textured regions 134 interleaving with the plurality of second planar regions 133, and each second planar region of the plurality of second planar regions 133 aligns with a respective passivation contact structure of a set of passivation contact structures of the plurality of passivation contact structures 140. With the plurality of second textured regions 134, the optical path of incident light in the substrate 123 can be increased, thereby improving the light-absorption efficiency of the substrate 123. With the plurality of second planar regions 133 aligning with passivation contact structures 140, the carrier recombination current at contact regions of the surface of the substrate 123 facing towards the selective passivation layer 124 with the passivation contact structures 140 can be reduced, thereby improving transfer efficiency of the carriers to the passivation contact structures 140.

Figure 5:
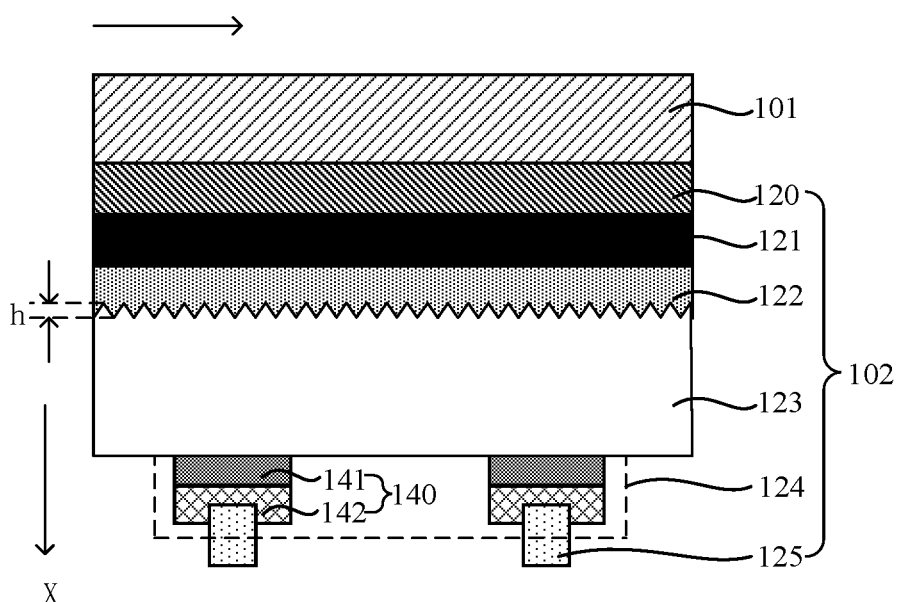
FIG. 5 is a schematic diagram of a sectional structure of one more solar cell according to some embodiments of the present disclosure.

Referring to FIGS. 1 and 5 in combination, FIG. 5 is a schematic diagram of a sectional structure of one more solar cell. In some embodiments, a surface of the substrate 123 facing towards the intrinsic amorphous silicon layer 122 has a plurality of textured structures.

Referring to the above-mentioned influence of the morphology of the surface of the substrate 123 facing towards the selective passivation layer 124 to the photoelectric conversion efficiency of the solar cell, when the surface of the substrate 123 facing towards the intrinsic amorphous silicon layer 122 is a polished surface, that is, the surface of the substrate 123 facing towards the intrinsic amorphous silicon layer 122 is a planar surface, the light-absorption efficiency of the substrate 123 is relatively low.

Therefore, the morphology of the surface of the substrate 123 facing towards the intrinsic amorphous silicon layer 122 in the bottom cell 102 may be set to a textured morphology. On the one hand, the textured morphology of the surface of the substrate 123 facing towards the intrinsic amorphous silicon layer 122 can increase the optical path of incident light in the substrate 123, thereby improving the light-absorption efficiency of incident light by the substrate 123. On the other hand, the textured morphology can increase the contact area between the substrate 123 and the intrinsic amorphous silicon layer 122, thereby reducing the loss of carriers during transfer from the substrate 123 to the intrinsic amorphous silicon layer 122, and improving the photoelectric conversion efficiency of the solar cell.

Moreover, the intrinsic amorphous silicon layer 122, the first doped conductive layer 121, and the transparent conductive layer 120 may be formed in sequence directly on the surface of the substrate 123 using a deposition process. When the surface of the substrate 123 facing towards the intrinsic amorphous silicon layer 122 has a plurality of textured structures, each of a surface of the intrinsic amorphous silicon layer 122, a surface of the first doped conductive layer 121, and a surface of the transparent conductive layer 120 which are away from the substrate 123 in the first direction has a plurality of textured structures. The textured structures of the transparent conductive layer 120 can play a role in trapping light and reducing reflection, i.e. reducing the reflection of light incident onto the surface of the bottom cell 102, thereby improving the light-absorption rate of the bottom cell 102, and improving the photoelectric conversion efficiency of the bottom cell 102.

In some embodiments, heights of the plurality of textured structures of the surface of the substrate 123 facing towards the intrinsic amorphous silicon layer 122 in the first direction range from 50 nm to 1 μm.

A height of one respective textured structure of the plurality of textured structures of the substrate 123 in the first direction refers to a maximum distance h along the first direction between any point on the one respective textured structure and the surface of the substrate 123 facing towards the intrinsic amorphous silicon layer 122.

Referring to the above analysis on the influence of morphology of the surface of the substrate 123 on the carrier recombination current at the surface of the substrate 123, when the surface of the substrate 123 facing towards the intrinsic amorphous silicon layer 122 has a plurality of textured structures, the carrier recombination current at the surface of substrate 123 increases to some extent. Due to the limited increase in light-absorption rate caused by the textured structures, when the heights of the plurality of textured structures of the surface of the substrate 123 facing towards the intrinsic amorphous silicon layer 122 in the first direction are too large, the influence of the increase in light-absorption rate resulted by the textured structures to photoelectric conversion efficiency may be less than the influence of the increase in carrier recombination current to the photoelectric conversion efficiency, such that the photoelectric conversion efficiency of the bottom cell 102 cannot be effectively improved. Moreover, a minimum increase in carrier recombination current in the substrate 123 caused by the textured structures is greater than a minimum increase in the light-absorption rate of the substrate 123 caused by the textured structures. Thus, when the heights of the plurality of textured structures of the surface of the substrate 123 facing towards the intrinsic amorphous silicon layer 122 in the first direction are too small, the influence on light-absorption rate resulted by the textured structures may be less than the influence on carrier recombination current resulted by the textured structures, such that the photoelectric conversion efficiency of the solar cell also cannot be effectively improved.

Therefore, the heights of the plurality of textured structures of the surface of the substrate 123 facing towards the intrinsic amorphous silicon layer 122 in the first direction may be set in a range of 50 nm to 1 μm, for example, 55 nm, 65 nm, 80 nm, 100 nm, 125 nm, 150 nm, 200 nm, 250 nm, 325 nm, 400 nm, 500 nm, 650 nm, 800 nm, or 950 nm. With the suitable heights, the increase in light-absorption rate of the substrate 123 resulted by the textured structures can be greater than the increase in carrier recombination current in the substrate 123 resulted by the textured structures, such that the photoelectric conversion efficiency of the solar cell can be effectively improved.

Referring to FIG. 1, in some embodiments, a thickness of the second doped conductive layer 142 in the first direction ranges from 5 nm to 150 nm.

The thickness of the second doped conductive layer 142 in the first direction refers to a distance d between a surface of the second doped conductive layer 142 contacting with the tunneling layer 141 and a surface of the second doped conductive layer 142 away from the substrate 123 in the first direction.

Due to the fact that the one or more electrodes 125 are formed on the surface of the selective passivation layer 124 away from the substrate 123 and are in ohmic contact with the second doped conductive layer 142, when the thickness of the second doped conductive layer 142 is too small, the formed one or more electrodes 125 may penetrate through the second doped conductive layer 142 and come into contact with the tunneling layer 141, resulting in the second doped conductive layer 142 not being able to have a good passivation effect, thereby causing a decrease in the photo-electric conversion efficiency of the bottom cell 102. When the thickness of the second doped conductive layer 142 is too large, after carriers pass through the tunneling layer 141 to the second doped conductive layer 142, the transfer distances of carriers during collection of carriers from the second doped conductive layer 142 to the one or more electrodes 125 are too large, which is likely to cause significant collection loss of carriers and limit to the pho-toelectric conversion efficiency of the bottom cell 102.

Therefore, the thickness of the second doped conductive layer 142 in the first direction may be set in a range of 5 nm to 150 nm. For example, the thickness of the second doped conductive layer 142 may be set to 7.5 nm, 10 nm, 15 nm, 20 nm, 30 nm, 45 nm, 60 nm, 80 nm, 100 nm, 125 nm, or 145 nm. By setting the thickness of the second doped conductive layer 142 in an appropriate range, the damage to the passivation effect of the second doped conductive layer 142 by the one or more electrodes 125 can be reduced. Moreover, the transfer distance of carriers passing through the second doped conductive layer 142 and collecting to the one or more electrodes 125 can be controlled within a relative small range, thereby reducing the collection loss of carriers in the bottom cell 102 and improving the photo-electric conversion efficiency of the bottom cell 102.

In some embodiments, a thickness of the tunneling layer 141 in the first direction ranges from 0.5 nm to 5 nm.

The thickness of the tunneling layer 141 in the first direction refers to a distance between a surface of the tunneling layer 141 contacting with the second doped con-ductive layer 142 and a surface of the tunneling layer 141 contacting with the substrate 123 in the first direction. When the thickness of the tunneling layer 141 is too small, the passivation performance of the passivation contact struc-tures 140 is poor, the loss in open-circuit voltage of the bottom cell 102 is large, and the ability of carriers to transfer from the substrate 123 to the tunneling layer 141 is poor. Due to the passivation performance of the passivation con-tact structures 140 having a certain upper limit, when the thickness of the tunneling layer 141 is too large, although the open-circuit voltage of the bottom cell 102 is increased as much as possible, the transfer distance of carriers from the tunneling layer 141 to the second doped conductive layer 142 is greatly increased, and the loss during transfer is also correspondingly increased.

Therefore, the thickness of the tunneling layer 141 in the first direction may be set in the range of 0.5 nm to 5 nm. For example, the thickness of the tunneling layer 141 may be set to 0.6 nm, 0.7 nm, 0.85 nm, 1 nm, 1.2 nm, 1.5 nm, 1.8 nm, 2.25 nm, 2.5 nm, 3.5 nm, or 4.25 nm. By setting the thickness of the tunneling layer 141 in an appropriate range, the passivation effect of the passivation contact structures 140 and the open-circuit voltage of the bottom cell 102 can be increased as much as possible, and the transfer loss of carriers in the tunneling layer 141 can be effectively limited, thereby improving the photoelectric conversion efficiency of the bottom cell 102.

In some embodiments, a width of one respective passi-vation contact structure of the plurality of passivation con-tact structures 140 in the second direction ranges from 10 μm to 100 μm.

The width of one respective passivation contact structure of the plurality of passivation contact structures 140 in the second direction refers to a distance w1 between two lateral edges opposite to each other of the one respective passiva-tion contact structure 140 in the second direction.

The plurality of passivation contact structures 140 are arranged depending on the design for the one or more electrodes 125. The plurality of passivation contact struc-tures 140 are in one-to-one correspondence to the one or more electrodes 125 or one passivation contact structure 140 corresponds to two or more electrodes of the one or more electrodes 125, and the one or more electrodes 125 are in ohmic contact with the second doped conductive layers 142 of the plurality of passivation contact structures 140. In order to obtain relatively low contact resistance between the one or more electrodes 125 and the second doped conductive layers 142, it is necessary to ensure that the contact area between the second doped conductive layers 142 and the one or more electrodes 125 is sufficiently large.

When the width of a passivation contact structure 140 is too small, the width of a corresponding second doped conductive layer 142 is also too small. Even if a correspond-ing electrode 125 covers the entire surface of the second doped conductive layer 142 facing towards the electrode 125, the contact area between the electrode 125 and the second doped conductive layer 142 is still small, and the contact resistance between the electrode 125 and the second doped conductive layer 142 is too large, resulting in rela-tively great collection loss of carriers in the electrode 125. When the width of a passivation contact structure 140 is too large, due to the limited total length of the substrate 123 in the second direction, the number of the passivation contact structures 140 that are formed at certain intervals on the surface of the substrate 123 will accordingly decrease, resulting in a decrease in the number of subsequently formed electrodes 125. Thus, the spacing between adjacent elec-trodes 125 in the second direction increases, the transfer distance for collection of the carriers in an intermediate region between two adjacent electrodes 125 is greatly increased, thereby resulting in a significant increase in collection loss of the carriers in electrodes 125.

Therefore, during forming the plurality of passivation contact structures 140, the width of one respective passiva-tion contact structure of the plurality of passivation contact structures 140 in the second direction may be set in the range of 10 μm to 100 μm. For example, the width of one respective passivation contact structure 140 may be set to 12 μm, 14 μm, 15 μm, 20 μm, 25 μm, 35 μm, 50 μm, 65 μm, 80 μm, or 95 μm. By setting the width of one respective passivation contact structure 140 in an appropriate range, the contact resistance between the one or more electrodes 125 and the second doped conductive layers 142 can be reduced, an increase in the collection loss of the carriers in an intermediate region between two adjacent electrodes 125 can be prevented, thereby improving the photoelectric con-version efficiency of the solar cell.

In embodiments of the present disclosure, for ease of understanding, exemplary illustration is made base on the plurality of passivation contact structures 140 extending in a direction perpendicular to the second direction. In practice, the extension direction of the plurality of passivation contact structures 140 and the second direction may form other angles, such as 30 degrees, 37 degrees, 45 degrees, 53 degrees, 60 degrees or the like. In this case, the width of one respective passivation contact structure 140 refers to a distance between two lateral edges opposite to each other of the one respective passivation contact structure 140 in a direction perpendicular to the extension direction.

Moreover, the plurality of passivation contact structures 140 and the corresponding one or more electrodes 125 have the same extension direction. During forming the plurality of passivation contact structures 140, the widths of the plurality of passivation contact structures 140 may be set depending on the widths of the one or more electrodes 125. A width of an electrode 125 refers to a distance between two lateral edges opposite to each other of the electrode 125 in a direction perpendicular to the extension direction.

Due to the fact that the one or more electrodes 125 are in ohmic contact with the second doped conductive layers 142 of the plurality of passivation contact structures 140, the contact resistance between the one or more electrodes 125 and the second doped conductive layers 142 is related to the contact area between the one or more electrodes and the second doped conductive layers. With a fixed extension length of one respective electrode, the contact area between the one or more electrodes 125 and the second doped conductive layers 142 is related to the widths of the one or more electrodes 125 and the widths of the plurality of passivation contact structures 140. When a width of one respective electrode 125 is greater than a width of one respective passive contact structure 140, a surface of the one respective electrode 125 facing towards the substrate 123 partially contacts the one respective second doped conductive layer 142, and the one respective electrode 125 cannot fully implement its collection performance for carriers.

Therefore, a width of one respective passivation contact structure 140 may be greater than or equal to a width of a corresponding electrode 125, so that when the electrode 125 aligns with the one respective passivation contact structure 140, in other words, when the centerline of the one respective passivation contact structure 140 along the extension direction coincides with the centerline of the electrode 125 along the extension direction or there is very little error between these two centerlines, the surface of the electrode 125 facing towards the substrate 123 is completely or almost completely in contact with the second doped conductive layer 142 of the one respective passivation contact structure. Thus, the collection ability for carriers of the electrode 125 and the second doped conductive layer 142 can be free of being limited by the width of the second doped conductive layer 142, thereby improving the carrier collection efficiency of the electrode 125.

In some embodiments, a distance between two adjacent passivation contact structures of the plurality of passivation contact structures in the second direction ranges from 0.5 mm to 1.5 mm.

The distance between two adjacent passivation contact structures 140 in the second direction refers to a distance w2 between a first lateral edge of one passivation contact structure 140 and a second lateral edge of the other passivation contact structure 140 opposite to the first lateral edge in the second direction.

Referring to the above analysis on the widths of the passivation contact structures 140 in the second direction, the passivation contact structures 140 are formed in correspondence to the one or more electrodes 125, while the total length of the substrate 123 in the second direction is limited. Regarding the widths of the passivation contact structures 140, when the spacing between adjacent passivation contact structures 140 is too small, the number of the passivation contact structures 140 and the one or more electrodes 125 formed along the second direction on the substrate 123 is too large. As a result, the cost of forming the one or more electrodes 125 of the bottom cell 102 is too high, and there is a significant waste of collection capacity for carriers of the one or more electrodes 125. When the spacing between adjacent passivation contact structures 140 is too large, the number of the passivation contact structures 140 and the one or more electrodes 125 formed along the second direction on the substrate 123 is too small. As a result, the collection loss of the carriers in an intermediate region between two adjacent electrodes 125 in the second direction is too large, resulting in a decrease in the photoelectric conversion efficiency of the bottom cell 102.

Therefore, during forming the passivation contact structures 140, a distance between adjacent passivation contact structures 140 in the second direction may be set in the range of 0.5 mm to 1.5 mm. For example, the distance between adjacent passivation contact structures 140 may be set to 0.55 mm, 0.6 mm, 0.75 mm, 0.9 mm, 1 mm, 1.2 mm, 1.35 mm or 1.45 mm. By setting the distance between adjacent passivation contact structures 140 in the second direction in an appropriate range, a cost of forming the passivation contact structures 140 and the one or more electrodes 125 of the bottom cell 102 can be reduced, an increase in the collection loss of the carriers in an intermediate region between two adjacent electrodes 125 can be prevented, thereby improving the photoelectric conversion efficiency of the solar cell.

In some embodiments, a ratio of an area of an orthographic projection of the selective passivation layer 124 on the substrate 123 in the first direction to an area of a surface of the substrate 123 facing towards the selective passivation layer ranges from 1% to 10%.

Referring to the above description and analysis on the widths of the passivation contact structures 140 and the distance between adjacent passivation contact structures 140, when a width of one respective passivation contact structure 140 or the distance between adjacent passivation contact structures 140 is fixed, the larger the ratio of the area of the orthographic projection of the selective passivation layer 124 on the substrate 123 in the first direction to the area of the surface of the substrate 123 on which the orthographic projection of the selective passivation layer 124 falls, the larger the number of the passivation contact structures 140 of the selective passivation layer 124, and the larger the density of the one or more electrodes 125 of the bottom cell 102.

When the ratio of the area of the orthographic projection of the selective passivation layer 124 on the substrate 123 to the area of the surface of the substrate 123 is too large, the density of the one or more electrodes 125 of the bottom cell 102 is too large, resulting an excessive production cost of the one or more electrodes 125 of the bottom cell 102, and a significant redundancy in collection ability for carriers of the one or more electrodes 125. When the ratio of the area of the orthographic projection of the selective passivation layer 124 on the substrate 123 to the area of the surface of the substrate 123 is too small, the density of the one or more electrodes 125 of the bottom cell 102 is too small, the distance between adjacent electrodes 125 in the second direction is too large, and a transfer distance of carriers from an intermediate region between the adjacent electrodes 125 to either one electrode 125 is too large, leading to an increase in the collection loss of the carriers in the one or more electrodes 125. Moreover, the plurality of passivation contact structures 140 cover a too small area, the passivation effect of the selective passivation layer 124 is limited, and
tunneling ability of the carriers in the substrate 123 is poor.

Therefore, during forming the selective passivation layer
124, the ratio of the area of the orthographic projection of the
selective passivation layer 124 on the substrate 123 in the
first direction to the area of the surface of the substrate 123
on which the orthographic projection of the selective pas-
sivation layer 124 falls may be set in the range of 1% to 10%.
For example, the ratio may be set to 1.5%, 2%, 3%, 4.5%,
6%, 8%, or 9%. By setting the area of the orthographic
projection of the selective passivation layer 124 on the
surface of the substrate 123 in an appropriate range, the
passivation effect of the selective passivation layer 124 and
the tunneling ability of carriers in the bottom cell 102 can be
secured, and production cost of the one or more electrodes
125 of the bottom cell 102 can be reduced.

In some embodiments, the first doped conductive layer
121 includes first doped ions, each of the substrate 123 and
the second doped conductive layer 142 includes second
doped ions, and the first doped ions are P-type ions and the
second doped ions are N-type ions, or the first doped ions are
N-type ions and the second doped ions are P-type ions.

The substrate 123 of the bottom cell 102 may be either a
P-type substrate or an N-type substrate. In order to form a
PN junction, the doping type of the first doped conductive
layer 121 is different from that of the substrate 123. In order
to form the plurality of passivation contact structures 140,
the doping type of the second doped conductive layer 142
needs to be the same as the doping type of the substrate 123.
Therefore, when the first doped conductive layer 121
includes first doped ions, each of the substrate 123 and the
second doped conductive layer 142 includes second doped
ions, and when the doping type of the substrate 123 is
P-type, the first doping ions are N-type ions, and the second
doping ions are P-type ions. When the doping type of the
substrate 123 is N-type, the first doped ions are P-type ions,
and the second doped ions are N-type ions.

In some embodiments, doping concentration of the first
doped ions in the first doped conductive layer 121 ranges
from $10^{17}/cm^3$ to $10^{19}/cm^3$.

During forming the first doped conductive layer 121, the
doping concentration of the first doped ions in the first doped
conductive layer 121 may be set in the range of $10^{17}/cm^3$ to
$10^{19}/cm^3$, for example, setting the doping concentration to
$2*10^{17}/cm^3$, $4*10^{17}/cm^3$, $7.5*10^{17}/cm^3$, $10^{18}/cm^3$, $3*10^{18}/$
$cm^3$, $6*10^{18}/cm^3$, $9*10^{18}/cm^3$, or the like. In this way,
relatively great transfer loss of carriers due to too low doping
concentration of the first doped conductive layer 121, and
excessive light-reflection ability of the first doped conduc-
tive layer 121 due to too high doping concentration can be
prevented, thereby reducing the transfer loss of carriers
between the bottom cell 102 and the thin-film solar cell 101,
improving the light-absorption rate of the substrate 123, and
improving the photoelectric conversion efficiency of the
solar cell.

In some embodiments, a thickness of the first doped
conductive layer 121 in the first direction ranges from 5 nm
to 30 nm. The thickness of the first doped conductive layer
121 in the first direction refers to a distance along the first
direction between a surface of the first doped conductive
layer 121 in contact with the intrinsic amorphous silicon
layer 122 and a surface of the first doped conductive layer
121 in contact with the transparent conductive layer 120.

The thickness of the first doped conductive layer 121 may
be set in the range of 5 nm to 30 nm, for example, 6 nm, 7.5
nm, 9 nm, 10 nm, 12.5 nm, 15.5 nm, 17.5 nm, 20 nm, 23 nm,
26 nm, or 28.5 nm. In this way, the absorption of the incident light of relatively large wavelengths by the first doped
conductive layer 121 can be reduced, and the first doped
conductive layer 121, cooperating with the intrinsic amor-
phous silicon layer 122, can have good passivation effect,
thereby increasing the open-circuit voltage of the bottom
cell 102, and improving the photoelectric conversion effi-
ciency of the bottom cell 102.

Figure 6:
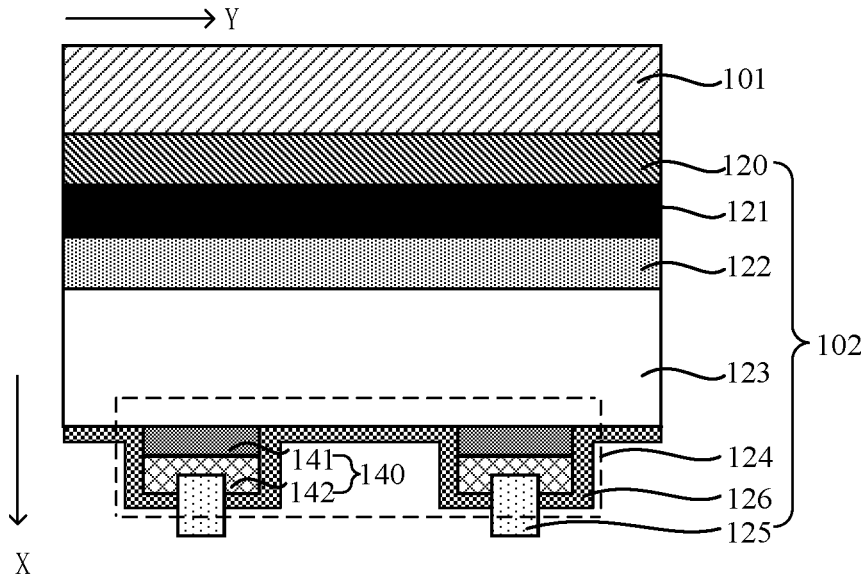
FIG. 6 is a schematic diagram of a sectional structure of one more solar cell according to some embodiments of the present disclosure.

Referring to FIGS. 1 and 6 in combination, FIG. 6 is a
schematic diagram of a sectional structure of one more solar
cell. In FIG. 6, the bottom cell 102 further includes an
anti-reflection layer 126. In some embodiments, the bottom
cell 102 further includes an anti-reflection layer 126 formed
on the surface of the selective passivation layer 124 away
from the substrate 123. The anti-reflection layer 126 covers
a portion of the surface of the substrate 123, as well as lateral
surfaces and surfaces away from the substrate 123 of at least
a part of the plurality of passivation contact structures 140.

During production of the bottom cell 102, the anti-
reflection layer 126 may also be formed on a side of the
bottom cell 102 away from the thin-film solar cell 101. The
anti-reflection layer 126 may cover the portions that are not
covered by the selective passivation layer 124 of the surface
of the substrate 123 facing towards the selective passivation
layer 124, and the anti-reflection layer 126 may further cover
the lateral surfaces and surfaces away from the substrate 123
of at least a part of the plurality of passivation contact
structures 140 of the selective passivation layer 124. For
case of understanding, embodiments of the present disclo-
sure are illustrated based on a case in which the anti-
reflection layer 126 completely covers the exposed surfaces
of the selective passivation layer 124 and the portions of the
surface of the substrate 123 that are not covered by the
selective passivation layer 124. In another case, the anti-
reflection layer 126 may partially cover the exposed surfaces
of the selective passivation layer 124 or the portions of the
surface of the substrate 123 that are not covered by the
selective passivation layer 124.

By forming the anti-reflection layer 126 on the side of the
bottom cell 102 away from the thin-film solar cell 101, the
anti-reflection layer 126 can reduce the reflection of incident
light by the bottom cell 102 and improve the light-absorp-
tion amount of the bottom cell 102. Moreover, the anti-
reflection layer 126 can cooperate with the plurality of
passivation contact structures 140 to further improve the
passivation effect of the bottom cell 102, thereby improving
the photoelectric conversion efficiency of the bottom cell.

In some embodiments, a surface of the anti-reflection
layer 126 away from the substrate 123 is a textured surface.

During forming the anti-reflection layer 126, the surface
of the anti-reflection layer 126 away from the substrate 123
may be formed as a textured surface. The textured structures
of the surface of the anti-reflection layer 126 away from the
substrate 123 can increase the optical paths of incident light
in the bottom cell 102, thereby further improving the light-
absorption efficiency of the bottom cell 102.

The surface of the anti-reflection layer 126 away from the
substrate 123 may be either a fully textured surface or a
partially textured surface. For example, portions of the
surface of the anti-reflection layer 126 away from the
substrate 123 that align with the portions of the surface of
the substrate 123 that are not covered by the plurality of
passivation contact structures 140 are textured, and the
remaining portions are planar. Alternatively, the portions of
the surface of the anti-reflection layer 126 away from the
substrate 123 that align with the portions of the surface of
the substrate 123 that are not covered by the plurality of passivation contact structures 140 are planar, and the remaining portions are textured.

In some embodiments, the thin-film solar cell 101 includes a perovskite thin-film solar cell, a copper indium gallium diselenide (CIGS) thin-film solar cell, a cadmium telluride thin-film solar cell, or a III to V-group thin-film solar cell.

Because the bottom cell 102 is based on the structure of a TOPCon solar cell, the wavelengths of light that can be absorbed by the bottom cell 102 are usually relatively large. Therefore, as a top cell, the thin-film solar cell 101 may be any one of a perovskite thin-film solar cell, a CIGS thin-film solar cell, a cadmium telluride thin-film solar cell, or a III to V-group thin-film solar cell that can absorb light of relatively small wavelengths.

Some embodiments of the present disclosure provide a solar cell, in the tandem solar cell, the bottom cell 102 is mainly based on a structure of a tunnel oxide passivated contact solar cell, with a front structure of the tunnel oxide passivated contact solar cell being replaced with a front structure of a heterojunction solar cell, and the thin-film solar cell 101 and the bottom cell 102 are connected using the transparent conductive layer 120 in the front structure of the heterojunction solar cell. With the replacement of the front structure, the bottom cell 102 can have a complete front structure, which can improve the open-circuit voltage of the bottom cell 102, and can prevent the formation of metal-semiconductor contact between the electrodes on the front surface and the transparent conductive layer 120 of the bottom cell 102. In this way, the contact recombination between the thin-film solar cell 101 and the bottom cell 102 can be reduced, and the photoelectric conversion efficiency of the solar cell can be improved. Moreover, the back passivation structure of the tunnel oxide passivated contact solar cell is replaced with a selective passivation layer 124 having a plurality of passivation contact structures 140 corresponding to the one or more electrodes 125, due to the fact that the plurality of passivation contact structures 140 only cover a part of the surface of the substrate 123, the one or more electrodes 125 can be formed using electroplating, thereby greatly reducing the possibility of burn-through of the second doped conductive layers 142 by the one or more electrodes 125. Therefore, the thicknesses of the second doped conductive layers 142 of the plurality of passivation contact structures 140 can be reduced. Furthermore, due to the transparent conductive layer 120 in the front structure, there is no need to form an additional intermediate layer to connect the bottom cell 102 and the top cell, thereby reducing the overall thickness and cost of the tandem solar cell.

Figure 7:
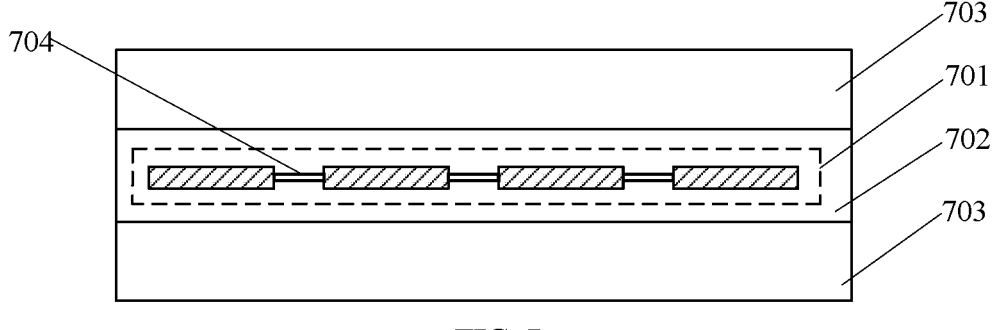
FIG. 7 is a structural schematic diagram of a photovoltaic module according to some embodiments of the present disclosure.

Some embodiments of the present disclosure provide a photovoltaic module. Referring to FIG. 7, the photovoltaic module includes one or more cell strings 701 formed by connecting a plurality of the solar cells as described above; one or more encapsulation layers 702 configured to cover at least one surface of the one or more cell strings 701; and one or more cover plates 703 configured to cover at least one surface of the one or more encapsulation layers 702 away from the one or more cell strings 701. Solar cells are electrically connected in whole or electrically connected in a form of multiple pieces to form a plurality of cell strings 701, and the plurality of cell strings 701 are electrically connected in series and/or in parallel.

In some embodiments, the plurality of cell strings 701 may be electrically connected using conductive strips 704. The one or more encapsulation layers 702 cover the front and back surfaces of the solar cells. In some embodiments, the encapsulation layer 702 may be an organic encapsulation adhesive film such as an ethylene vinyl acetate copolymer (EVA) adhesive film, a polyethylene octene co-elastomer (POE) adhesive film, or a polyethylene glycol terephthalate (PET) adhesive film. In some embodiments, the cover plates 703 may be glass cover plates, plastic cover plates, or other cover plates 703 having light transmission function. The surface of the cover plate 703 facing towards the encapsulation layer 702 may be a textured surface, thereby increasing the utilization rate of incident light.

Although the present disclosure is described with reference to above preferred embodiments, the claims are not limited to these embodiments. Various possible changes and modifications may be made by those skilled in the art on the basis of the concepts of the present disclosure, without departing from the spirit and scope of the present disclosure. Therefore, the scope of protection of the present disclosure shall be subject to the scope defined by the claims.

What is claimed is:

1. A solar cell, comprising a thin-film solar cell and a bottom cell stacked in a first direction, wherein the bottom cell has a stacked structure in the first direction including:
a transparent conductive layer, a first doped conductive layer, an intrinsic amorphous silicon layer, a substrate, a selective passivation layer, and one or more electrodes, wherein the transparent conductive layer is between the thin-film solar cell and the first doped conductive layer;
wherein the selective passivation layer covers a portion of a surface of the substrate away from the intrinsic amorphous silicon layer and includes a plurality of passivation contact structures arranged at intervals in a second direction, wherein each passivation contact structure of the plurality of passivation contact structures includes a tunneling layer and a second doped conductive layer stacked in the first direction;
wherein the one or more electrodes are formed on a surface of the selective passivation layer away from the substrate, at least one electrode of the one or more electrodes is in ohmic contact with the second doped conductive layer of a respective passivation contact structure of the plurality of passivation contact structures;
wherein the first doped conductive layer includes a doped amorphous silicon layer or a doped microcrystalline silicon layer; and
wherein a ratio of an area of an orthographic projection of the selective passivation layer on the substrate in the first direction to an area of the surface of the substrate away from the intrinsic amorphous silicon layer is in the range of 1% to 10%.

2. The solar cell according to claim 1, wherein a thickness of the second doped conductive layer in the first direction ranges from 5 nm to 150 nm.

3. The solar cell according to claim 1, wherein a width of one respective passivation contact structure of the plurality of passivation contact structures in the second direction ranges from 10 μm to 100 μm.

4. The solar cell according to claim 1, wherein a surface of the substrate facing towards the selective passivation layer has a plurality of textured regions and a plurality of planar regions, each textured region of the plurality of textured regions aligns with a respective passivation contact structure of a set of passivation contact structures of the plurality of passivation contact structures, and each planar region of the plurality of planar regions is formed between two adjacent textured regions of the plurality of textured regions.

5. The solar cell according to claim 4, wherein surfaces of the second doped conductive layers of at least a part of the set of passivation contact structures facing towards the one or more electrodes are textured surfaces.

6. The solar cell according to claim 1, wherein a surface of the substrate facing towards the selective passivation layer has a plurality of textured regions and a plurality of planar regions, each planar region of the plurality of planar regions aligns with a respective passivation contact structure of a set of passivation contact structures of the plurality of passivation contact structures, and each textured region of the plurality of textured regions is formed between two adjacent planar regions of the plurality of planar regions.

7. The solar cell according to claim 1, wherein a distance between two adjacent passivation contact structures of the plurality of passivation contact structures in the second direction ranges from 0.5 mm to 1.5 mm.

8. The solar cell according to claim 1, wherein a surface of the substrate facing towards the intrinsic amorphous silicon layer has a plurality of textured structures.

9. The solar cell according to claim 8, wherein heights of the plurality of textured structures of the surface of the substrate facing towards the intrinsic amorphous silicon layer in the first direction range from 50 nm to 1 μm.

10. The solar cell according to claim 1, wherein the first doped conductive layer includes first doped ions, each of the substrate and the second doped conductive layer includes second doped ions, and the first doped ions are P-type ions and the second doped ions are N-type ions, or the first doped ions are N-type ions and the second doped ions are P-type ions.

11. The solar cell according to claim 1, wherein the bottom cell further includes an anti-reflection layer;
   wherein the anti-reflection layer is formed on a surface of the selective passivation layer away from the substrate, and the anti-reflection layer covers a portion of a surface of the substrate facing towards the selective passivation layer and covers lateral surfaces and surfaces away from the substrate of at least a portion of the plurality of passivation contact structures.

12. The solar cell according to claim 11, wherein a surface of the anti-reflection layer away from the substrate is a textured surface.

13. The solar cell according to claim 1, wherein the thin-film solar cell includes a perovskite thin-film solar cell, a copper indium gallium diselenide (CIGS) thin-film solar cell, a cadmium telluride thin-film solar cell, or a III-V-group thin-film solar cell.

14. A photovoltaic module, comprising:
   one or more cell strings formed by connecting a plurality of solar cells;
   one or more encapsulation layers configured to cover at least one surface of the one or more cell strings; and
   one or more cover plates configured to cover at least one surface of the one or more encapsulation layers away from the one or more cell strings;
   wherein each solar cell of the plurality of the solar cells includes a thin-film solar cell and a bottom cell stacked in a first direction, wherein the bottom cell has a stacked structure in the first direction including:

a transparent conductive layer, a first doped conductive layer, an intrinsic amorphous silicon layer, a substrate, a selective passivation layer, and one or more electrodes, wherein the transparent conductive layer is between the thin-film solar cell and the first doped conductive layer;
   wherein the selective passivation layer covers a portion of a surface of the substrate away from the intrinsic amorphous silicon layer and includes a plurality of passivation contact structures arranged at intervals in a second direction, wherein each passivation contact structure of the plurality of passivation contact structures includes a tunneling layer and a second doped conductive layer stacked in the first direction;
   wherein the one or more electrodes are formed on a surface of the selective passivation layer away from the substrate, at least one electrode of the one or more electrodes is in ohmic contact with the second doped conductive layer of a respective passivation contact structure of the plurality of passivation contact structures;
   wherein the first doped conductive layer includes a doped amorphous silicon layer or a doped microcrystalline silicon layer; and
   wherein a ratio of an area of an orthographic projection of the selective passivation layer on the substrate in the first direction to an area of the surface of the substrate away from the intrinsic amorphous silicon layer is in the range of 1% to 10%.

15. The photovoltaic module according to claim 14, wherein a surface of the substrate facing towards the selective passivation layer has a plurality of textured regions and a plurality of planar regions, each textured region of the plurality of textured regions aligns with a respective passivation contact structure of a set of passivation contact structures of the plurality of passivation contact structures, and each planar region of the plurality of planar regions is formed between two adjacent textured regions of the plurality of textured regions.

16. The photovoltaic module according to claim 15, wherein surfaces of the second doped conductive layers of at least a part of the set of passivation contact structures facing towards the one or more electrodes are textured surfaces.

17. The photovoltaic module according to claim 14, wherein a surface of the substrate facing towards the selective passivation layer has a plurality of textured regions and a plurality of planar regions, each planar region of the plurality of planar regions aligns with a respective passivation contact structure of a set of passivation contact structures of the plurality of passivation contact structures, and each textured region of the plurality of textured regions is formed between two adjacent planar regions of the plurality of planar regions.

18. The photovoltaic module according to claim 14, wherein the first doped conductive layer includes first doped ions, each of the substrate and the second doped conductive layer includes second doped ions, and the first doped ions are P-type ions and the second doped ions are N-type ions, or the first doped ions are N-type ions and the second doped ions are P-type ions.

* * * * *